United States Patent
Shimizu et al.

(10) Patent No.: US 8,766,277 B2
(45) Date of Patent: Jul. 1, 2014

(54) SEMICONDUCTOR DEVICE AND MANUFACTURING METHOD OF THE SAME

(75) Inventors: Haruka Shimizu, Kodaira (JP); Natsuki Yokoyama, Mitaka (JP)

(73) Assignee: Renesas Electronics Corporation, Kanagawa (JP)

( * ) Notice: Subject to any disclaimer, the term of this patent is extended or adjusted under 35 U.S.C. 154(b) by 240 days.

(21) Appl. No.: 13/020,125

(22) Filed: Feb. 3, 2011

(65) Prior Publication Data
US 2011/0198613 A1  Aug. 18, 2011

(30) Foreign Application Priority Data
Feb. 17, 2010 (JP) .................. 2010-032276

(51) Int. Cl.
*H01L 29/15* (2006.01)
(52) U.S. Cl.
USPC ............ 257/77; 257/263; 257/E29.104
(58) Field of Classification Search
USPC ............ 257/77, E29.104, E29.089, 263
See application file for complete search history.

(56) References Cited

U.S. PATENT DOCUMENTS

| | | | | |
|---|---|---|---|---|
| 6,551,865 B2 * | 4/2003 | Kumar et al. | .................. | 438/137 |
| 6,917,054 B2 | 7/2005 | Onose et al. | | |
| 7,211,845 B1 * | 5/2007 | Yu et al. | ......................... | 257/263 |
| 2003/0042491 A1 * | 3/2003 | Kumar et al. | .................... | 257/77 |
| 2003/0042538 A1 * | 3/2003 | Kumar et al. | .................. | 257/328 |
| 2005/0218424 A1 | 10/2005 | Onose et al. | | |
| 2006/0199312 A1 * | 9/2006 | Harris et al. | .................. | 438/133 |
| 2006/0216879 A1 | 9/2006 | Nonaka et al. | | |
| 2007/0096145 A1 | 5/2007 | Watanabe | | |
| 2009/0014719 A1 * | 1/2009 | Shimizu et al. | .................. | 257/49 |
| 2012/0205668 A1 | 8/2012 | Watanabe | | |

FOREIGN PATENT DOCUMENTS

| | | |
|---|---|---|
| JP | 2003-152195 A | 5/2003 |
| JP | 2004-134547 A | 4/2004 |
| JP | 2006-269679 A | 10/2006 |
| JP | 2007-128965 A | 5/2007 |

OTHER PUBLICATIONS

Japanese Office Action received in Japanese Application No. 2010-032276 dated Jan. 7, 2014.

\* cited by examiner

*Primary Examiner* — Wael Fahmy
*Assistant Examiner* — Sarah Salerno
(74) *Attorney, Agent, or Firm* — Mattingly & Malur, PC

(57) ABSTRACT

The leakage current generated in a pn junction region between a gate and a source is reduced in a junction FET using a silicon carbide substrate. In a trench junction FET using a silicon carbide substrate, nitrogen is introduced into a sidewall and a bottom surface of a trench, thereby forming an n type layer and an $n^+$ type layer on a surface of the trench. In this manner, the pn junction region corresponding to the junction region between a $p^+$ type gate region and an $n^+$ type source region is exposed on a main surface of a semiconductor substrate instead of on the damaged sidewall of the trench, and also the exposed region thereof is narrowed. Accordingly, the leakage current in the pn junction region can be reduced.

12 Claims, 11 Drawing Sheets

US 8,766,277 B2

SEMICONDUCTOR DEVICE AND MANUFACTURING METHOD OF THE SAME

CROSS-REFERENCE TO RELATED APPLICATION

The present application claims priority from Japanese Patent Application No. 2010-032276 filed on Feb. 17, 2010, the content of which is hereby incorporated by reference to this application.

TECHNICAL FIELD OF THE INVENTION

The present invention relates to a semiconductor device and a manufacturing method of the same, and more particularly to a technology effectively applied to a semiconductor device using silicon carbide for a substrate and its manufacture.

BACKGROUND OF THE INVENTION

In a power semiconductor device, on-resistance and withstand voltage are in a trade-off relationship and defined by a band gap value of a substrate material. Therefore, for offering greater performance than a device formed by using a silicon (Si) substrate, which has been widely used as a power device, it is an effective way to use a substrate material having a larger band gap than that of silicon. In particular, silicon carbide (SiC) has a sufficiently large band gap about three times as large as that of silicon, and when compared with a case of using a substrate made of gallium nitride (GaN) or the like, a substrate made of silicon carbide has characteristics that semiconductor regions of p type and n type conductivities can be easily formed and oxide films can be formed by thermal oxidation. Therefore, silicon carbide has the possibility of achieving a device such as a high-performance MOSFET (Metal Oxide Semiconductor Field Effect Transistor) and is attracting a lot of attention.

However, an oxide film formed on a SiC substrate has a serious problem. That is, when the SiC substrate is thermally oxidized, carbon (C) remains in an oxide film formed on a surface of the SiC substrate and a high-density interface state is formed in the oxide film. As a result, the channel mobility of MOSFET is greatly deteriorated, and the on-resistance of the device is significantly increased. Furthermore, carbon in an oxide film causes the decrease in reliability of the oxide film, which is the major hindrance to the achievement of the MOSFET using a SiC substrate.

A junction FET (Junction Field Effect Transistor: J-FET) has been known as a device structure capable of avoiding the above-described problem of the oxide film interface. The junction FET is a type of device in which a pn junction is used as a gate to control a channel, and is a normally-on device in which a negative voltage is usually applied to a gate to extend a depletion layer in a channel, thereby turning off the conduction between a source and a drain. From a fail-safe perspective, the use of the normally-on device is limited so as not to decrease the reliability. Therefore, a normally-off type is generally desired in the power device. In the junction FET using a silicon substrate, the increase of the withstand voltage in the normally-off type is difficult, but when a SiC substrate is used, the increase of the withstand voltage in the normally-off type can be achieved by narrowing the channel width. This is because the diffusion potential of the pn junction of SiC is as high as about 2.5 V and the channel can be completely depleted even when a negative voltage is not applied to a gate. By this means, the high-performance normally-off junction FET capable of avoiding the problem of the interface state of an oxide film can be achieved.

For example, Japanese Patent Application Laid-Open Publication No. 2004-134547 (Patent Document 1) is publicly known as a document relating to a normally-off silicon carbide junction FET. The Patent Document 1 discloses a technology for a junction FET or a static induction transistor using a SiC substrate, in which an ion implantation with a relatively low energy is performed when forming a p type gate region, thereby achieving the reduction in on-resistance and improving the blocking effect.

Here, FIG. 17 shows the junction FET shown in FIG. 6 according to the fourth embodiment of the Patent Document 1. The junction FET shown in FIG. 17 is formed on an $n^+$ type substrate to be a drain region, and a drain electrode 6 is formed on a lower surface of the $n^+$ type substrate 1. An $n^-$ type drift layer 2 is formed on the $n^+$ type substrate 1, and a plurality of trenches 5 extending in a direction along a main surface of the $n^+$ type substrate 1 are formed and arranged in a stripe shape on an upper surface of the $n^-$ type drift layer 2. On the parts of the upper surface of the $n^-$ type drift layer 2 on which the trenches 5 are not formed, source regions 23 are formed along the trenches 5 in a stripe shape. More specifically, the $n^-$ type drift layer 2 is formed on the $n^+$ type substrate 1, the source regions 23 are formed on the $n^-$ type drift layer 2, and the trenches 5 reaching an intermediate depth of the $n^-$ type drift layer 2 from upper surfaces of the source regions 23 are formed. A source contact layer 7 is formed in an extending direction of the trench 5 on each upper surface of the adjacent source regions 23 respectively interposing the trench 5 therebetween except on the edge portions of the upper surface of the source region 23 near the trenches 5.

On a surface of the $n^-$ type drift layer 2 and a sidewall and a bottom surface of each trench 5, gate regions 24 are formed except the regions on which the source regions 23 are formed. Note that the gate region 24 formed on the sidewall of the trench 5 is in contact with the source region 23 in contact with the sidewall of the same trench 5 on an upper surface of the gate region 24, and a pn junction region corresponding to an interface between the gate region 24 and the source region 23 is exposed from a semiconductor substrate 21 on the sidewall of the trench 5.

SUMMARY OF THE INVENTION

The conventional normally-off silicon carbide junction FET as shown in FIG. 17 has the problem that the leakage current tends to flow in forward and reverse directions between a gate and a source for the following two reasons.

The first reason is that, since the high concentration $n^+$ type and $p^+$ type regions are in direct contact with each other at the interface between a gate and a source, the amount of leakage current generated at the junction portion between the $n^+$ type and $p^+$ type regions is large. This arises from a structural issue that the high concentration regions are joined and many defects occur near the junction and a material issue that the crystal recovery of SiC is incomplete and defects are likely to remain.

The second reason is that the junction portion between the gate region 24 and the source region 23 is exposed from the semiconductor substrate 21 on the sidewall of the trench 5 as shown in FIG. 17 and a large amount of leakage current is generated on the sidewall of the trench 5 at the junction portion between the gate region 24 and the source region 23. This arises from the fact that damages remain on the crystal on the surface of the semiconductor substrate 21 because the trenches 5 are formed by the processing of the dry etching and the fact that the interface state density is extremely high because much carbon remains at the interface between an oxide film (not shown) formed on the trench surface and SiC (semiconductor substrate 21).

Due to these causes, the conventional normally-off silicon carbide junction FET has the problem of the large leakage current in forward and reverse directions between a gate and a source.

Note that there is a method of preventing the generation of the leakage current by forming the gate region and the source region so as not to be in contact with each other like in the junction FET shown in FIG. 1 of the Patent Document 1, but it is difficult to obtain the withstand voltage of 600 V or higher in such a junction FET.

An object of the present invention is to reduce the leakage current between a gate and a source in a junction FET using a SiC substrate.

The above and other objects and novel characteristics of the present invention will be apparent from the description of the present specification and the accompanying drawings.

The following is a brief description of an outline of the typical invention disclosed in the present application.

A semiconductor device according to one invention of the present application includes: a semiconductor substrate of a first conductivity type; a drift layer of the first conductivity type formed on the semiconductor substrate; a source region of the first conductivity type formed on an upper surface of the drift layer; a trench reaching an intermediate depth of the drift layer from an upper surface of the source region; and a gate region of a second conductivity type formed on a sidewall and a bottom surface of the trench in the drift layer below the source region. In the semiconductor device according to one invention of the present application, nitrogen is introduced into the sidewall and the bottom surface of the trench on which the gate region is formed.

The effects obtained by typical embodiments of the invention disclosed in the present application will be briefly described below.

In a normally-off junction FET using a SiC substrate, a semiconductor device in which leakage current between a gate and a source is reduced is provided.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when the number of elements (including number of pieces, values, amount, range, and the like) are mentioned, the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are of course not excluded except the case where it is particularly specified that A is the only element thereof.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, when the materials and the like are mentioned, the specified material is a main material unless otherwise stated or except the case where it is not so in principle or situationally, and the secondary components, additives, additional components and the like are not excluded. For example, a silicon material includes not only the case of pure silicon but also secondary and ternary alloys (for example, SiGe) and the like formed of additive impurities and silicon as the main component unless otherwise stated.

Further, components having the same function are denoted by the same reference symbols throughout the drawings for describing the embodiments, and the repetitive description thereof is omitted.

Still further, in some drawings used in the embodiments, hatching is used in some cases even in a plan view so as to make the drawings easy to see.

(First Embodiment)

A mode of the semiconductor device according to the first embodiment will be described below with reference to the drawings.

Figure 1:
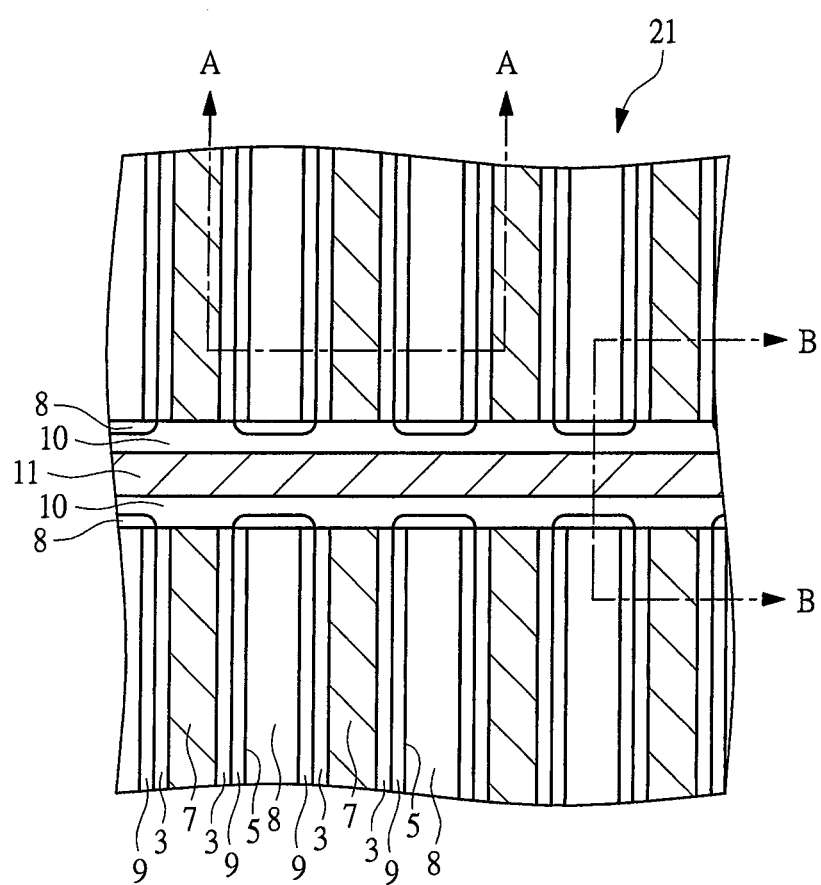
FIG. 1 is a plan view of a junction FET according to the first embodiment of the present invention.
Figure 2:
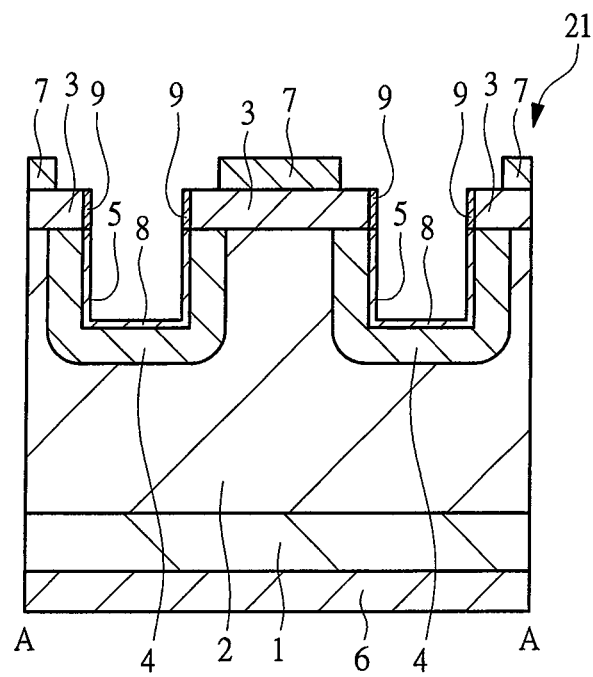
FIG. 2 is a cross-sectional view taken along the line A-A in FIG. 1.
Figure 3:
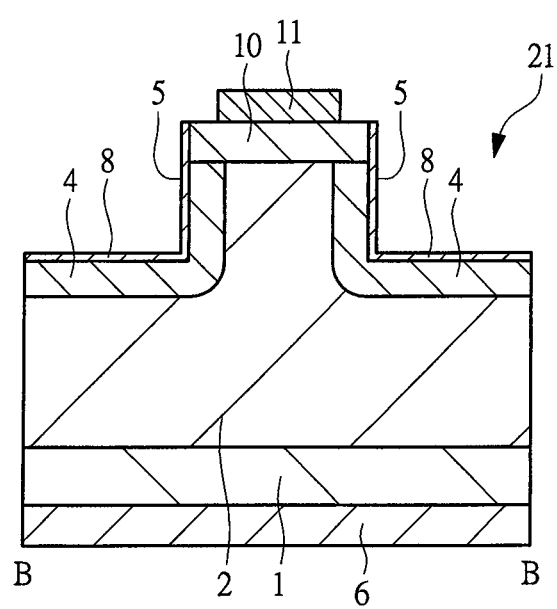
FIG. 3 is a cross-sectional view taken along the line B-B in FIG. 1.

FIG. 1 is a plan view of the junction FET according to the first embodiment. FIG. 2 and FIG. 3 are cross-sectional views taken along the lines A-A and B-B in FIG. 1, respectively. Note that an interlayer insulating film formed so as to fill trenches 5, wirings and insulating films formed thereon are not illustrated in FIG. 1, FIG. 2 and FIG. 3.

As shown in FIG. 2, the junction FET of the present embodiment is formed on an $n^+$ type substrate 1 to be a drain region, and a drain electrode 6 is formed on a lower surface of the $n^+$ type substrate 1. An $n^-$ type drift layer 2 is formed on the $n^+$ type substrate 1, and a plurality of trenches 5 extending in a direction along a main surface of the $n^+$ type substrate 1 are formed and arranged in a stripe shape on an upper surface of the $n^-$ type drift layer 2. On the parts of the upper surface of the $n^-$ type drift layer 2 on which the trenches 5 are not formed, $n^+$ type source regions 3 are formed along the trenches 5 in a stripe shape. More specifically, the $n^-$ type drift layer 2 is formed on the $n^+$ type substrate 1, the $n^+$ type source regions 3 are formed on the $n^-$ type drift layer 2, and the trenches 5 reaching an intermediate depth of the $n^-$ type drift layer 2 from upper surfaces of the $n^+$ type source regions 3 are formed. A source contact layer 7 is formed in an extending direction of the trench 5 on each upper surface of the adjacent $n^+$ type source regions 3 respectively interposing the trench 5 therebetween except on the edge portions of the upper surface of the $n^+$ type source region 3 near the trenches 5.

In the shallow regions of the surface of the $n^-$ type drift layer 2 and the sidewalls and bottom surfaces of the trenches 5 except the sidewalls of the $n^+$ type source regions 3, n type layers 8 are formed, and in the shallow regions of the sidewalls of the trenches 5 and the sidewalls of the $n^+$ type source regions 3, $n^+$ type layers 9 are formed. Further, on the surface of the $n^-$ type drift layer 2 and the sidewalls and bottom surfaces of the trenches 5, $p^+$ type gate regions 4 are formed in the regions deeper than the n type layers 8 from the sidewalls or bottom surfaces of the trenches 5. Note that the $p^+$ type gate regions 4 formed on the sidewalls of the adjacent trenches 5 interposing the $n^+$ type source region 3 therebetween are separated by the $n^-$ type drift layer 2 and are not in contact with each other. Furthermore, the $p^+$ type gate region 4 formed on the sidewall of the trench 5 and the $n^+$ type source region 3 in contact with the sidewall of the same trench 5 are in contact with each other on an upper surface of the $p^+$ type gate region 4.

Further, as shown in FIG. 3, the junction FET of the present embodiment is formed on the $n^+$ type substrate 1, and the drain electrode 6 is formed on the lower surface of the $n^+$ type substrate 1. The $n^-$ type drift layer 2 is formed on the $n^+$ type substrate 1, a $p^+$ type gate junction layer 10 is formed on the $n^-$ type drift layer 2, the trenches 5 are formed from an upper surface of the $p^+$ type gate junction layer 10 to an intermediate depth of the $n^-$ type drift layer 2, and the plurality of trenches 5 interposing the $p^+$ type gate junction layer 10 are formed along the main surface of the $n^+$ type substrate 1 and arranged in a stripe shape in a direction orthogonal to the extending direction of the $p^+$ type gate junction layer 10. On the upper surface of the $p^+$ type gate junction layer 10, a gate contact layer 11 is formed so as to extend in a direction along the extending direction of the $p^+$ type gate junction layer 10 except the edge portions of the upper surface of the $p^+$ type gate junction layer 10 near the trenches 5. Note that the semiconductor region including the $n^+$ type substrate 1, the $n^-$ type drift layer 2, the $n^+$ type source regions 3 (see FIG. 2), the $p^+$ type gate region 4, the n type layers 8, the $n^+$ type layers 9 (see FIG. 2) and the $p^+$ type gate junction layer 10 is defined as the semiconductor substrate 21.

In FIG. 3, in the shallow regions of the sidewalls and the bottom surfaces of the trenches 5, the n type layers 8 are formed, and in the deeper regions of the sidewalls and the bottom surfaces of the trenches 5 than the n type layers 8, the $p^+$ type gate regions 4 are formed expect the region in which the $p^+$ type gate junction layer 10 is formed. Note that the $p^+$ type gate regions 4 formed on the sidewalls of the adjacent trenches 5 interposing the $p^+$ type gate junction layer 10 therebetween are separated by the $n^-$ type drift layer 2 and are not in contact with each other. Furthermore, the $p^+$ type gate region 4 formed on the sidewall of the trench 5 and the $p^+$ type gate junction layer 10 in contact with the sidewall of the same trench 5 are in contact with each other on the upper surface of the $p^+$ type gate region 4.

As shown in FIG. 2, since the n type layer 8 and the $n^+$ type layer 9 are formed on the side surface of the trench 5 and the side surface and the bottom surface of the trench 5 are covered with the n type layer 8 and the $n^+$ type layer 9, a pn junction region corresponding to the interface between the $p^+$ type gate region 4 and the $n^+$ type source region 3 is not exposed to the surface of the trench 5. Also, as shown in FIG. 3, the n type layer 8 is formed on the side surface of the trench 5, and a pn junction region corresponding to the interface between the $p^+$ type gate region 4 and the $n^+$ type source region 3 is not exposed to the surface of the trench 5 and an pn junction region is exposed on a main surface of the semiconductor substrate 21 at the interface between the $p^+$ type gate junction layer 10 and the n type layer 8.

Furthermore, as shown in FIG. 1, the junction FET of the present embodiment has the $p^+$ type gate junction layer 10 extending on the main surface of the semiconductor substrate 21 in a planar shape, and the junction FET of the present embodiment has also the $n^+$ type source regions 3 formed in a stripe shape in the direction orthogonal to the extending direction of the $p^+$ type gate junction layer 10 so as to interpose the $p^+$ type gate junction layer 10 and the source contact layers 7 formed on the $n^+$ type source regions 3. The trenches 5 whose surfaces are covered with the n type layers 8 and the $n^+$ type layers 9 are formed between the adjacent $n^+$ type source regions 3. Also, though not shown, oxide films are formed on the surfaces of the n type layers 8 and the $n^+$ type layers 9 formed on the sidewalls and the bottom surfaces of the trenches 5.

Although FIG. 1 shows only an active region in which current flows, termination regions for field relaxation are formed in the regions (not shown) around the active region. Note that the termination region is a p type semiconductor region formed by ion-implanting impurities into the upper surface of the $n^-$ type drift layer 2 (not shown) so as to surround the active region shown in FIG. 1. Further, though not shown, a plurality of two-layer wirings made of aluminum (Al) are provided on the source contact layers 7 and the gate contact layers 11 on the main surface side of the $n^+$ type substrate 1 (not shown). The two-layer wirings are respectively connected to source pads and gate pads on the main surface side of the semiconductor device, and the semiconductor device of the present embodiment has the structure including three terminals such as the source pads and the gate pads on the main surface side and drain pads on the rear surface side.

The n⁻ type drift layer 2 shown in FIG. 2 and FIG. 3 is an n⁻ type semiconductor region formed by epitaxial growth on the n⁺ type substrate 1 which is a low-resistance region made of SiC and having an impurity concentration lower than that of the n⁺ type substrate 1. The junction FET of the present embodiment is intended for the withstand voltage class of 600 V, and the concentration of nitrogen (N) which is an impurity in the n⁻ type drift layer 2 is set to $2 \times 10^{16}$ cm$^{-3}$, and the thickness of the n⁻ type drift layer 2 in a direction vertical to the main surface of the n⁺ type substrate 1 is set to 6 μm. The p⁺ type gate region 4 and the p⁺ type gate junction layer 10 are low-resistance regions obtained by introducing a p type impurity (for example, aluminum) at a high concentration into the n⁻ type drift layer 2, and the peak concentration of the p⁺ type gate region 4 is about $1 \times 10^{18}$ cm$^{-3}$. The n⁺ type source region 3 is a low-resistance region obtained by introducing an n type impurity (for example, nitrogen) at a high concentration into the n⁻ type drift layer 2. Also, the drain electrode 6, the source contact layer 7 and the gate contact layer 11 are silicide layers for making contact with the above-described other two-layer wirings. Further, the n type layer 8 and the n⁺ type layer 9 are semiconductor regions formed by introducing nitrogen as an impurity into the surfaces of the p⁺ type gate region 4, the p⁺ type gate junction layer 10 and the n⁺ type source region 3, and the nitrogen concentration of the n type layer 8 is desirably $1 \times 10^{18}$ cm$^{-3}$ or lower. If the nitrogen concentration is higher than $1 \times 10^{18}$ cm$^{-3}$, the recombination center near the pn junction region, which is the interface between the n type layer 8 and the p⁺ type gate region 4 and the p⁺ type gate junction layer 10, is increased, which becomes a factor for the increase in leakage current.

Note that the n⁺ type layer 9 is the region obtained by further implanting nitrogen into the sidewall of the n⁺ type source region 3 to which nitrogen has already been introduced at a high concentration, and there is little difference in nitrogen concentration between the n⁺ type source region 3 and the n⁺ type layer 9.

The depth of each trench 5 in the direction vertical to the main surface of the n⁺ type substrate 1 is 1.2 μm, and the width thereof in the direction orthogonal to the extending direction of the trenches 5 formed in a stripe shape and along the main surface of the n⁺ type substrate 1 is 1 μm. The width of each n⁺ type source region 3 in the same direction as the width direction of the trench 5 has a range of 0.8 to 1.0 μm because it directly relates to device characteristics such as the threshold voltage and others.

Next, the operation of the junction FET of the present embodiment will be described.

First, in a blocking state (off state), a voltage as high as 100 V to several kV is applied to a drain while 0 V or negative voltage is applied to a gate (p⁺ type gate region 4). At this time, in the channel, a depletion layer extends from the p⁺ type gate regions 4 in the n⁻ type drift layer 2 between the adjacent p⁺ type gate regions 4, and the energy barrier exists in the channel between the source and the drain. This barrier enables the blocking in the off state.

On the other hand, in an on state, a voltage of about 2.5 V is applied to the gate (p⁺ type gate region 4) and a voltage of about 1 to 2 V is applied to the drain (drain electrode 6). By this means, the range in which the depletion layer is formed in the channel between gates is narrowed and the carrier path is formed, so that the carriers flow from the source (n⁺ type source region 3) to the drain.

At this time, the voltage applied between the gate and the source is about 2.5 V, and it does not exceed the diffusion potential of the pn junction of SiC. However, many levels exist in the neighborhood of the pn junction region at the interface between the p⁺ type gate region 4 and the n⁺ type source region 3 and at the semiconductor oxide film interface, and the recombination current flows via the levels.

Figure 17:
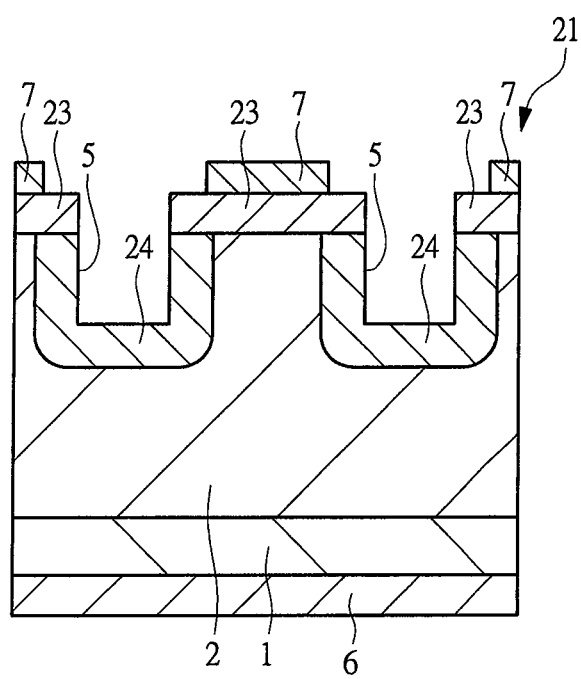
FIG. 17 is a cross-sectional view showing the conventional junction FET.

In the conventional junction FET shown in FIG. 17, on and off between the source and the drain can be switched by the similar operation, but it has the problem that the leakage current corresponding to the above-described recombination current tends to be generated. In the conventional junction FET, since the junction portion between the gate region 24 and the source region 23 is exposed from the semiconductor substrate 21 on the sidewall of the trench 5, the leakage current on the surface of the sidewall of the trench 5 tends to be generated in the junction portion between the gate region 24 and the source region 23.

This arises from the fact that damages by the dry etching remain on the crystal on the side surface and the bottom surface of the trench 5 because the trench 5 is formed by removing a part of the semiconductor substrate 21 by the dry etching and the fact that the interface state density is extremely high because much carbon remains at the interface between an oxide film (not shown) formed on the surface of the trench 5 and SiC (semiconductor substrate 21). Furthermore, in the conventional junction FET shown in FIG. 17, since the pn junction region is exposed from the surface of the semiconductor substrate 21 on the sidewall of the trench 5, there is a possibility that the leakage current flows in all of the regions of the sidewalls of the trenches 5 formed in a stripe shape. More specifically, since the region in which the leakage current tends to be generated is large, the total amount of leakage current flowing in the entire semiconductor substrate 21 is increased.

In the junction FET of the present embodiment, different from the conventional junction FET shown in FIG. 17, the surface of the trench is covered with the n type layer 8 and the n⁺ type layer 9 containing nitrogen as shown in FIG. 2. Therefore, the pn junction region at the interface between the p⁺ type gate region 4 and the n⁺ type source region 3 is not exposed on the sidewall of the trench 5, and the generation of the leakage current in the pn junction region on the sidewall of the trench 5 can be prevented.

Also, although the pn junction region at the interface between the p⁺ type gate junction layer 10 and the n type layer 8 formed on the side surface thereof is exposed at the edge portion on the upper surface of the p⁺ type gate junction layer 10 as shown in FIG. 3, this pn junction region is not the surface formed by the dry etching unlike the sidewall of the trench 5 and is not damaged by the dry etching. More specifically, since the pn junction region exposed in the junction FET of the present embodiment shown in FIG. 3 has less crystal defects and much less recombination centers than the pn junction region exposed in the conventional junction FET shown in FIG. 17, the generation of the leakage current can be significantly reduced.

Note that the region in which the pn junction region at the interface between the p⁺ type gate junction layer 10 and the n type layer 8 formed on the side surface thereof is exposed shown in FIG. 3 exists only at the edge portions of the p⁺ type gate junction layer 10, and the exposed area of the pn junction region is smaller compared with the conventional case where the pn junction region is exposed on each sidewall of the many trenches 5 formed in a stripe shape. Accordingly, the amount of generated leakage current can be reduced in the junction FET of the present embodiment.

Next, the manufacturing method of the junction FET of the present embodiment will be described with reference to FIG. 4 to FIG. 11.

Figure 4:
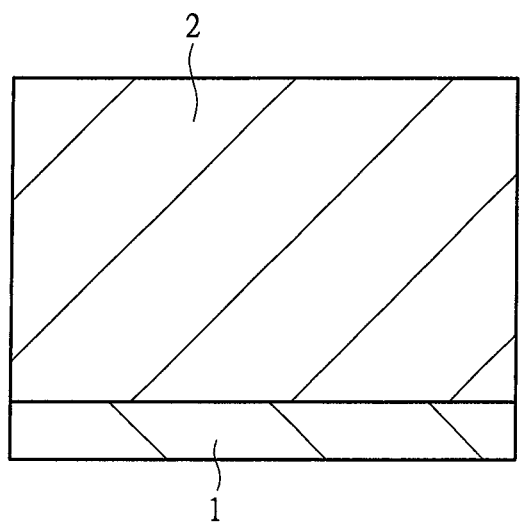
FIG. 4 is a cross-sectional view for describing the manufacturing method of the semiconductor device according to the first embodiment of the present invention.

First, as shown in FIG. 4, an epitaxial layer is grown on the $n^+$ type substrate 1 made of SiC to form the $n^-$ type drift layer 2. The SiC constituting the $n^+$ type substrate 1 has various surface orientations, that is, a Si (silicon) surface which is a representative surface orientation of SiC, a C (carbon) surface which is a surface on an opposite side of the Si surface and a (11-20) surface which is a side surface of SiC and vertically intersects with the Si surface and the C surface. Here, the surface orientation of the main surface of the $n^+$ type substrate 1 on which the epitaxial layer is grown is the Si surface and the off angle thereof is 8 degrees. However, the surface orientation of the main surface of the $n^+$ type substrate 1 may be the C surface or the (11-20) surface, and the off angle may be 4 degrees or 0 degree as long as the epitaxial layer to be the $n^-$ type drift layer 2 can be evenly grown.

Subsequently, though not shown, a silicon oxide film is deposited on the $n^-$ type drift layer 2 by the CVD (Chemical Vapor Deposition) method, and a p type impurity (for example, aluminum) is ion-implanted into the upper surface of the $n^-$ type drift layer 2 with using the silicon oxide film processed by the lithography and the dry etching as a hard mask, thereby forming the p type region to be the termination region. Thereafter, the hard mask made of the silicon oxide film is removed.

The concentration of aluminum implanted when forming the termination region is about $1 \times 10^{17}$ $cm^{-3}$. Since the termination region has to be formed so as to reach a deeper region than the $p^+$ type gate region 4 shown in FIG. 2 from the upper surface of the semiconductor substrate 21 toward the lower surface direction, the multi-step implantation to a maximum of 2 MeV is necessary. The JTE (Junction Termination Extension) structure forming the termination region is adopted in the present embodiment, but the guard ring structure, the mesa structure or the other structure may be adopted instead of the JTE structure. Note that the guard ring structure and the mesa structure are the structures formed around an active region for the purpose of field relaxation of the active region like the JTE structure, and are formed by the method of implanting an impurity into a substrate surface, the method of forming metal wirings, the method of forming trenches and others.

Figure 5:
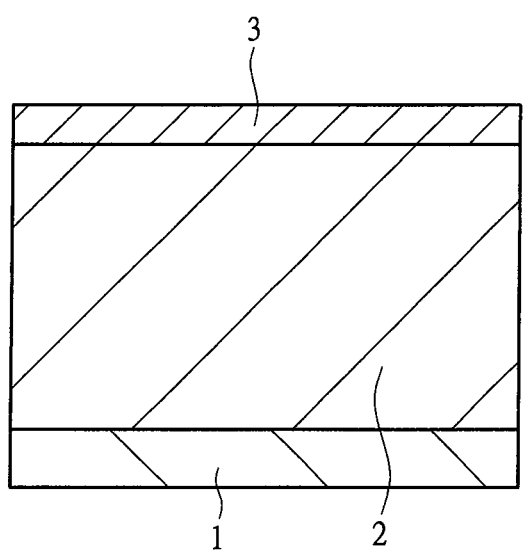
FIG. 5 is a cross-sectional view for describing the manufacturing method of the semiconductor device continued from FIG. 4.

Next, as shown in FIG. 5, the $n^+$ type source region 3 to be the source and the $p^+$ type gate junction layer 10 (not shown) to be the gate contact layer are formed by the same method as the formation method of the termination region. In FIG. 5, the $n^+$ type source region 3 is formed on the entire upper surface of the $n^-$ type drift layer 2, but actually it is not formed on the gate contact layer and in the termination region. Here, in the same manner as the process of forming the termination region, a hard mask made of a silicon oxide film is formed and the ion implantation is separately performed, and then the hard mask made of the silicon oxide film is removed. As the ion species implanted into the upper surface of the $n^-$ type drift layer 2 when forming the $n^+$ type source region 3, nitrogen is implanted into the $n^+$ type source region which is an $n^+$ type region and aluminum is implanted into the $p^+$ type gate junction layer 10 which is a $p^+$ type region so as to reduce the sheet resistance. Note that the nitrogen ion implantation is performed at 500° C. for securing the gate withstand voltage.

Figure 6:
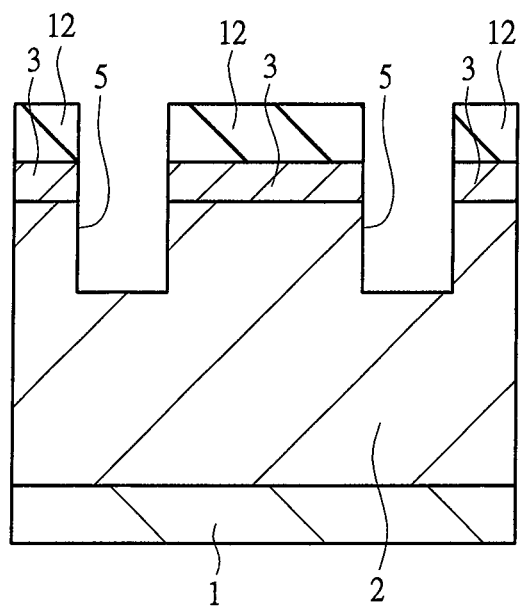
FIG. 6 is a cross-sectional view for describing the manufacturing method of the semiconductor device continued from FIG. 5.

Next, as shown in FIG. 6, a silicon oxide film 12 is deposited on the $n^+$ type source region 3, and the trenches 5 which penetrate through the $n^+$ type source region 3 and reach an intermediate depth of the $n^-$ type drift layer 2 are formed by the dry etching with using the silicon oxide film 12 processed by the lithography and the dry etching as a hard mask. At this time, in order to keep the channel width constant, the trenches 5 are desirably formed in the direction close to the vertical direction to the main surface of the $n^+$ type substrate 1 as far as possible.

Figure 7:
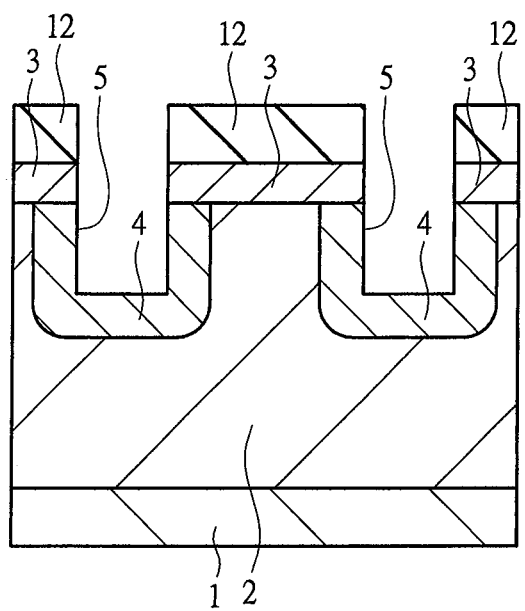
FIG. 7 is a cross-sectional view for describing the manufacturing method of the semiconductor device continued from FIG. 6.

Next, as shown in FIG. 7, with using the silicon oxide film 12 used when processing the trenches 5 described in FIG. 6 directly as a hard mask, the $n^+$ type gate regions 4 to be the gates are formed by the ion implantation on the side surfaces and the bottom surfaces of the trenches 5. The ion specie implanted at this time is aluminum, the $p^+$ type gate region 4 on the sidewall of the trench 5 is formed by the oblique ion implantation, and the $p^+$ type gate region 4 on the bottom surface of the trench 5 is formed by the vertical ion implantation. The angle of the oblique ion implantation is tilted by 25 degrees with respect to the direction vertical to the main surface of the $n^+$ type substrate 1, and the implantation energy is 100 keV at a maximum. The vertical ion implantation to the bottom surface of the trench 5 is performed at an angle vertical to the main surface of the $n^+$ type substrate 1, and the implantation energy is 150 keV at a maximum in the multi-step implantation. Also in the process of the oblique ion implantation and the vertical ion implantation for forming the $p^+$ type gate regions 4, like in the process of forming the $p^+$ type gate junction layer 10, the implantation is performed at the temperature of 500° C. in order to reduce the gate resistance. However, the ion implantation may be performed at a room temperature if there is no problem even when the gate withstand voltage is as low as about 5 V.

Figure 8:
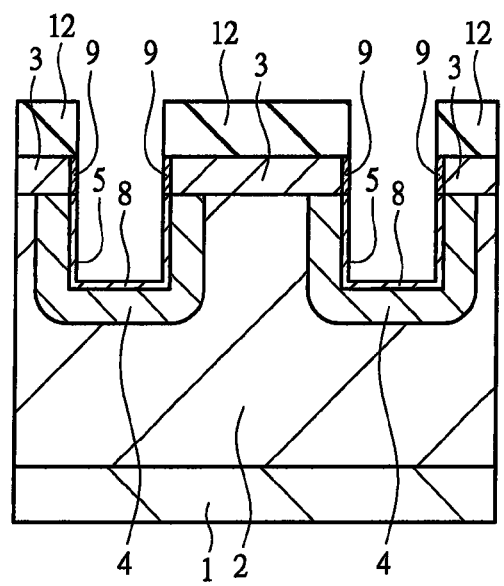
FIG. 8 is a cross-sectional view for describing the manufacturing method of the semiconductor device continued from FIG. 7.

Next, as shown in FIG. 8, with using the silicon oxide film 12 formed in the process described with reference to FIG. 6 as a hard mask, an n type impurity is implanted into the surfaces of the trenches 5. The ion specie to be implanted is nitrogen, the implantation energy is 20 keV, and the dose amount is $1 \times 10^{13}$ $cm^{-2}$. By this means, the concentration of nitrogen on the surface of the trench 5 becomes about $1 \times 10^{18}$ $cm^{-3}$. The implantation angle in the implantation of nitrogen into the trench 5 is tilted by 25 degrees with respect to the direction vertical to the main surface of the $n^+$ type substrate 1 like in the ion implantation in the process of forming the $p^+$ type gate region 4 described with reference to FIG. 7. In this manner, the n type layer 8 is formed on the surface of the trench 5 and the surface of the $p^+$ type gate region 4, and the $n^+$ type layer 9 is formed on the surface of the trench 5 and on the side surface of the $n^+$ type source region 3.

Figure 9:
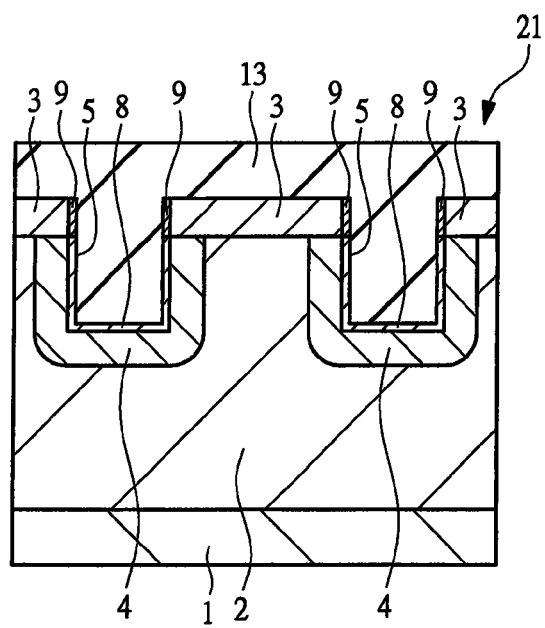
FIG. 9 is a cross-sectional view for describing the manufacturing method of the semiconductor device continued from FIG. 8.

Next, as shown in FIG. 9, the activation annealing is performed at about 1600° C. to oxidize the surface of the semiconductor substrate 21, and after the hard mask (silicon oxide film 12) is removed, the trenches 5 are filled. The trenches 5 are filled by depositing a silicon oxide film on the semiconductor substrate 21 by the CVD method to form an interlayer insulating film 13 made of the silicon oxide film. The planarization of the upper surface of the interlayer insulating film 13 is performed by the etch back, but there is no problem even when the planarization is performed by other methods such as CMP (Chemical Mechanical Polishing) and the like.

Figure 10:
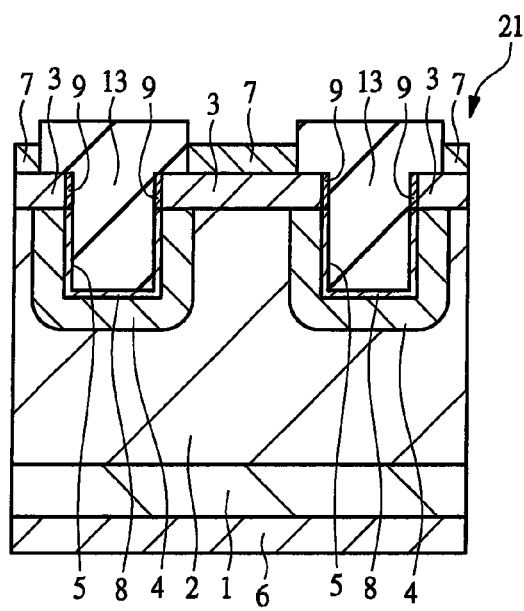
FIG. 10 is a cross-sectional view for describing the manufacturing method of the semiconductor device continued from FIG. 9.

Next, as shown in FIG. 10, contacts are formed on the main surface and the rear surface of the semiconductor substrate 21. In the process of forming the source and gate contacts on the main surface side of the semiconductor substrate 21, contact holes reaching the respective upper surfaces of the $n^+$ type source region 3 and the $p^+$ type gate junction layer 10 (not shown) are first formed in the interlayer insulating film 13 on the $n^+$ type source region 3 and the $p^+$ type gate junction layer 10 by the lithography and the dry etching. Thereafter, a nickel (Ni) film is deposited on the exposed n+ type source region 3, p+ type gate junction layer 10 and the interlayer insulating film 13 by the sputtering method, the annealing is performed at 1000° C. to form nickel silicide on each of the n+ type source region 3 and the p+ type gate junction layer 10 on which the nickel film has been deposited, and finally the unreacted metal film is removed. In this manner, the source contact layer 7 and the gate contact layer 11 (not shown) made of the nickel silicide are formed on each of the n+ type source region 3 and the p+ type gate junction layer 10. Also on the rear surface of the n+ type substrate 1, similarly, after a nickel film is deposited on the rear surface of the n+ type substrate 1, the silicidation annealing is performed at 1000° C. to form nickel silicide on the rear surface of the n+ type substrate 1. In this manner, the drain electrode 6 made of the nickel silicide is formed on the rear surface of the n+ type substrate 1.

Figure 11:
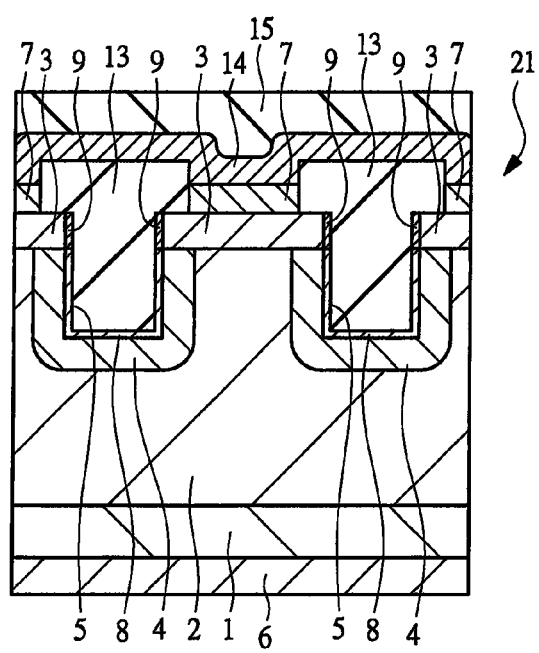
FIG. 11 is a cross-sectional view for describing the manufacturing method of the semiconductor device continued from FIG. 10.

Next, as shown in FIG. 11, after forming the aluminum wiring 14 by the sputtering method on the interlayer insulating film 13, an insulating film 15 is formed by the CVD method so as to cover the upper surface of the aluminum wiring 14. Thereafter, though not shown, a part of the insulating film 15 is removed by the lithography and the dry etching to expose the upper surface of the aluminum wiring 14 and form openings for the source pad and the gate pad, thereby completing the junction FET of the present embodiment. Note that the impurity implanted when forming the p+ type gate junction layer 10 and the gate contact layer 11 is aluminum in the present embodiment, but boron (B) may be implanted instead of aluminum.

Figure 12:
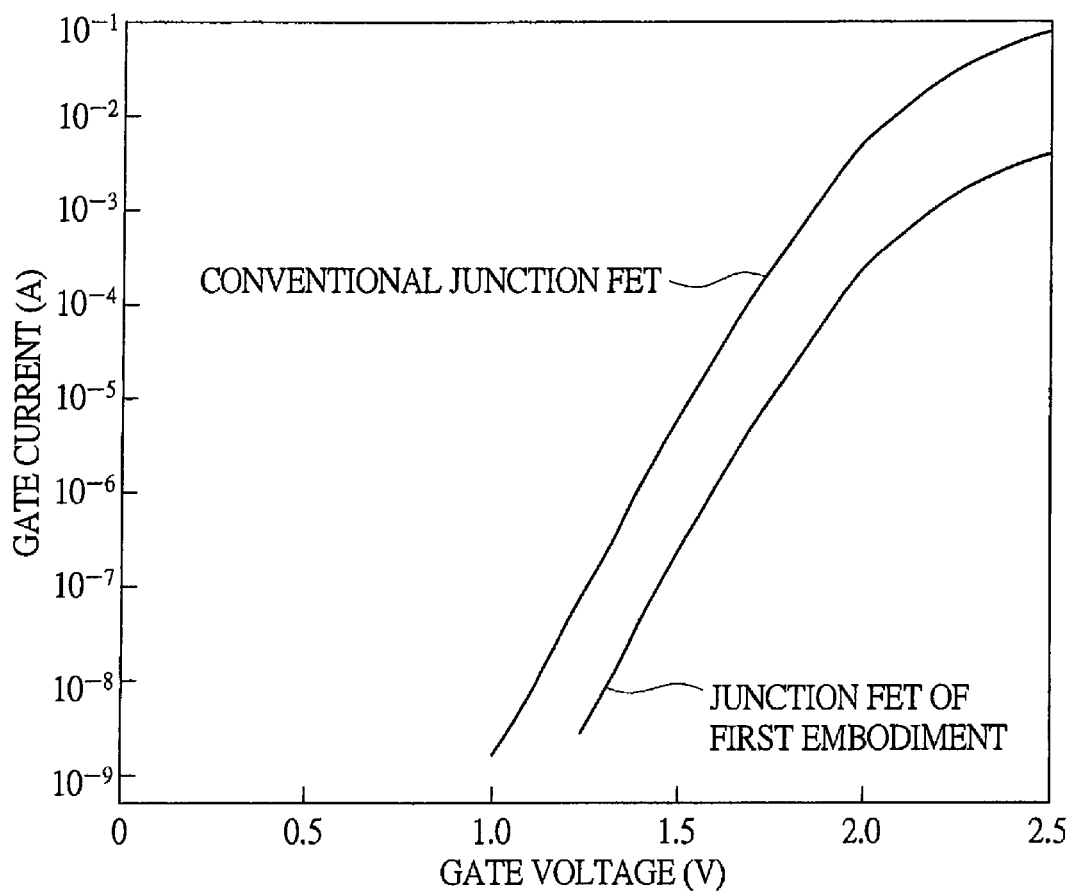
FIG. 12 is a graph for describing the characteristics of the junction FET according to the first embodiment of the present invention and the conventional junction FET.

Next, the effect of the present invention will be described with reference to the drawing showing the characteristics of the junction FET of the present embodiment. FIG. 12 shows the gate voltage-gate current characteristics of the respective FETs in the case where the junction FET of the present embodiment and the conventional junction FET shown in FIG. 17 are simultaneously formed on the same substrate. As shown in FIG. 12, it can be understood that the leakage current when applying a positive voltage to the gate is reduced in the junction FET of the present embodiment by about two orders of magnitude compared with that of the conventional junction FET. This results from the following two reasons.

Firstly, while the pn junction region is exposed from the semiconductor substrate 21 on all of the sidewalls of the plurality of trenches 5 and the exposed regions of the pn junction regions are large as shown in the cross-sectional view of FIG. 17 in the conventional junction FET, the pn junction region is not exposed as shown in the cross-sectional view of FIG. 2 and the pn junction region is exposed only on the upper surfaces of the edge portions of the p+ type gate junction layer 10 as shown in the cross-sectional view of FIG. 3 in the junction FET of the present embodiment. More specifically, the pn junction region exposed from the semiconductor substrate 21 is only the junction region between the p+ type gate junction layer 10 and the n type layer 8 in the junction FET of the present embodiment, and the exposed region of the pn junction region is narrowed in the entire semiconductor device compared with the conventional junction FET. Since one of the factors for the generation of the leakage current is the recombination of the pn junction region, the leakage current is reduced as the pn junction region exposed from the semiconductor substrate 21 is narrowed. Therefore, since the region from which the leakage current is to be generated is narrowed, the magnitude of the leakage current to be generated is also significantly reduced in the junction FET of the present embodiment.

Secondly, the surface on which the pn junction region is exposed is not the sidewall of the trench 5 but is only the main surface of the semiconductor substrate 21 in the junction FET of the present embodiment. Since the recombination center which is one factor for the generation of the leakage current is less on the main surface of the semiconductor substrate 21 than on the sidewall of the trench 5 damaged by the dry etching, the leakage current is reduced in the junction FET of the present invention compared with the conventional junction FET. The recombination in bulk is also conceivable as a factor for the generation of the leakage current, but since the concentration of the p type region of the gate is reduced to about $1 \times 10^{18}$ cm$^{-3}$ in the conventional junction FET described in the Patent Document 1 and the junction FET of the present embodiment, the recombination current in the bulk is lower than the recombination current on the surface, and the influence by the recombination current in the bulk is negligible.

As described above, in the present embodiment, nitrogen is introduced to the sidewall and the bottom surface of each trench 5 in the normally-off trench junction FET, and by this means, the leakage current between the gate and the source can be reduced.

(Second Embodiment)

Figure 13:
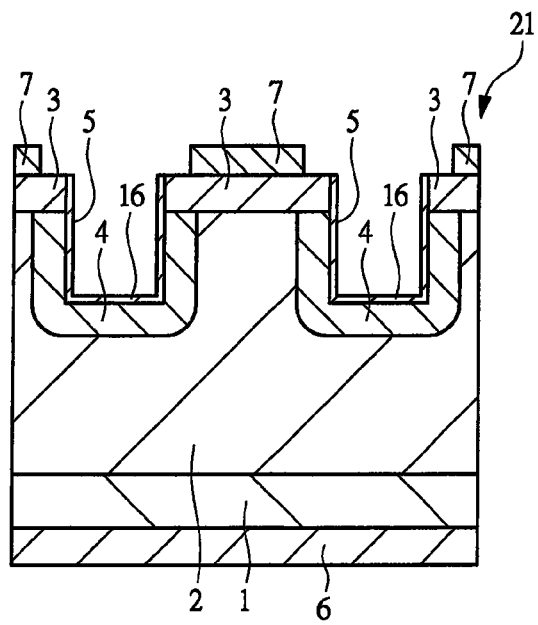
FIG. 13 is a cross-sectional view of a junction FET according to the second embodiment of the present invention.

Next, the junction FET of the second embodiment will be described with reference to the cross-sectional view shown in FIG. 13. The junction FET of the present embodiment has the n− type drift layer 2 formed on the n+ type substrate 1 by the epitaxial growth, and the n+ type source regions 3 are formed on the upper surface of the n− type drift layer 2. The trenches 5 which penetrate through the n+ type source region 3 and reach an intermediate depth of the n− type drift layer 2 are formed, and the p+ type gate regions 4 are formed in the n− type drift layer 2 on the sidewalls and the bottom surfaces of the trenches 5. A semiconductor oxide film 16 which is an insulator material film made of a silicon oxide film is formed on the sidewall and bottom surface of each trench 5. Note that the region including the n+ type substrate 1, the n− type drift layer 2, the n+ type source regions 3, the p+ type gate regions 4, the semiconductor oxide films 16 and the p+ type gate junction layer 10 (not shown) is defined as the semiconductor substrate 21.

In the first embodiment, the pn junction region is not exposed on the sidewall and the bottom surface of each trench 5 and an oxide film is formed on the sidewall and the bottom surface of each trench 5 though not shown in FIG. 2. The difference between the present embodiment and the first embodiment lies in the point that the n type layer 8 and the n+ type layer 9 are formed on the sidewall and the bottom surface of each trench 5 as shown in FIG. 2 in the first embodiment, while nitrogen is introduced to the surface of the semiconductor oxide film 16 formed on the sidewall and the bottom surface of each trench 5 to form a passivation film made of a silicon oxynitride film on the surface of each trench 5 as shown in FIG. 13 in the present embodiment. Also, the point that the pn junction region is exposed on the surface of each trench 5 in the present embodiment is also different from the first embodiment. Furthermore, in the junction FET of the present embodiment, nitrogen is present only on the surface of the semiconductor oxide film 16 on the sidewall and the bottom surface of each trench 5 and forms a silicon oxynitride film, but does not function as dopant.

Figure 14:
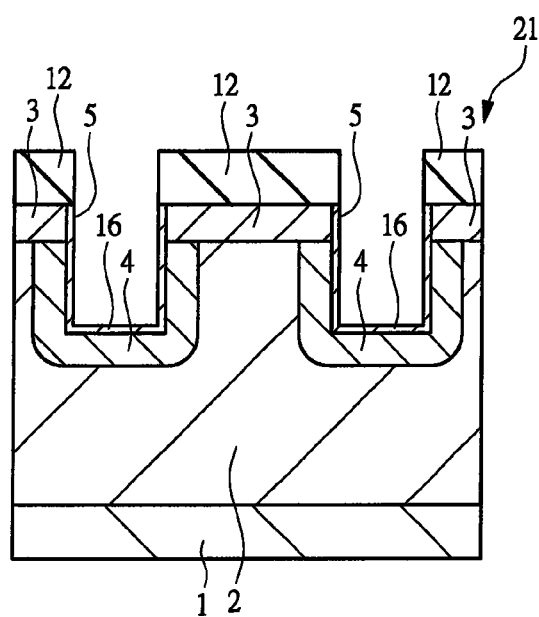
FIG. 14 is a cross-sectional view for describing the manufacturing method of the semiconductor device according to the second embodiment of the present invention.

Next, the manufacturing method of the junction FET of the present embodiment will be described. First, the process up to the step of forming the p+ type gate region 4 shown in FIG. 7 is performed in the same manner as the first embodiment. Thereafter, as shown in FIG. 14, after sacrificial oxidation is performed by annealing the semiconductor substrate 21 at high temperature and an oxide film formed on the surface of the semiconductor substrate 21 including the sidewalls of the trenches 5 by the sacrificial oxidation is removed, the surfaces of the trenches 5 are oxidized in $N_2O$ atmosphere at a temperature of 1300° C. In this manner, nitrogen is introduced into the surface of the semiconductor oxide film 16, and the interface state density on the surface of the trench 5 is significantly reduced. At this time, since the silicon oxide film 12 is formed on the upper surface of the $n^+$ type source region 3, the upper surface of the $n^+$ type source region 3 covered with the silicon oxide film 12 is not oxidized and nitrogen is not introduced thereto.

Note that, by adding the step of removing the oxide film formed by the sacrificial oxidation before nitrogen is introduced by the oxidation in the $N_2O$ atmosphere at 1300° C., the part of the sidewall and the bottom surface of the trenches 5 damaged by the dry etching for forming the trenches 5 or the ion implantation in the process of forming the $p^+$ type gate regions 4 can be removed.

Also, the reason why the high temperature of 1300° C. is set as the oxidation temperature in introducing nitrogen into the surface of the semiconductor oxide film 16 is that SiC is stronger in bonding between atoms and more thermally stable than Si. More specifically, since the thermal oxidation rate of SiC is 25 times as slow as that of Si, the nitridation by NO or $N_2O$ hardly occurs at the temperature of lower than 1200° C. and there is almost no effect of the reduction of the surface state density. Further, the high-temperature thermal oxidation is effective also for the prevention of the cluster of surplus carbon by the thermal oxidation. Accordingly, the oxidation temperature in introducing nitrogen into the surface of the semiconductor oxide film 16 is desirably 1200° C. or higher, and nitrogen is introduced at the temperature of 1300° C. in the present embodiment.

Figure 15:
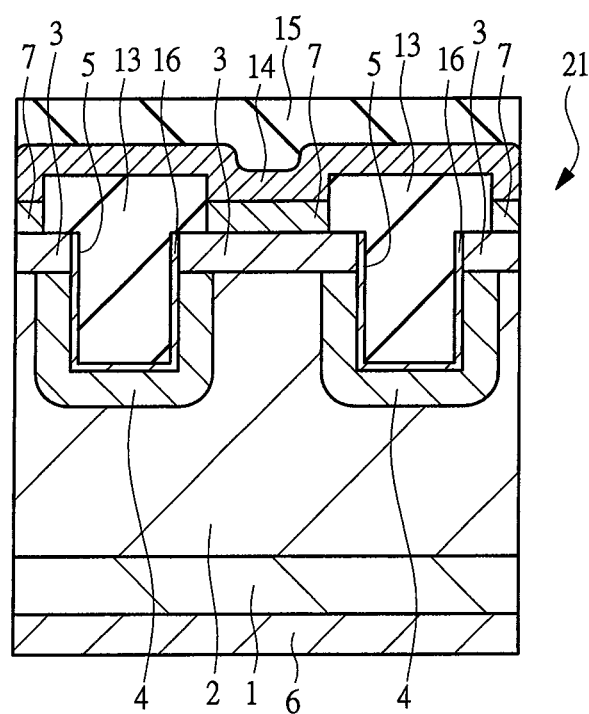
FIG. 15 is a cross-sectional view for describing the manufacturing method of the semiconductor device continued from FIG. 14.

The subsequent process after the step of filling the trenches including the silicidation and the formation of the wirings is performed in the same manner as the process in the first embodiment shown in FIG. 10 and following figures, thereby completing the semiconductor device shown in FIG. 15. The means for introducing nitrogen into the surface of the semiconductor oxide film 16 may be the NO annealing after the wet oxidation or the like, but since the interface state density can be reduced most by the $N_2O$ oxidation on the (11-20) surface which is the surface of the sidewall of the trench 5 particularly important in the present embodiment, the oxidation is performed in the $N_2O$ atmosphere in the present embodiment.

Figure 16:
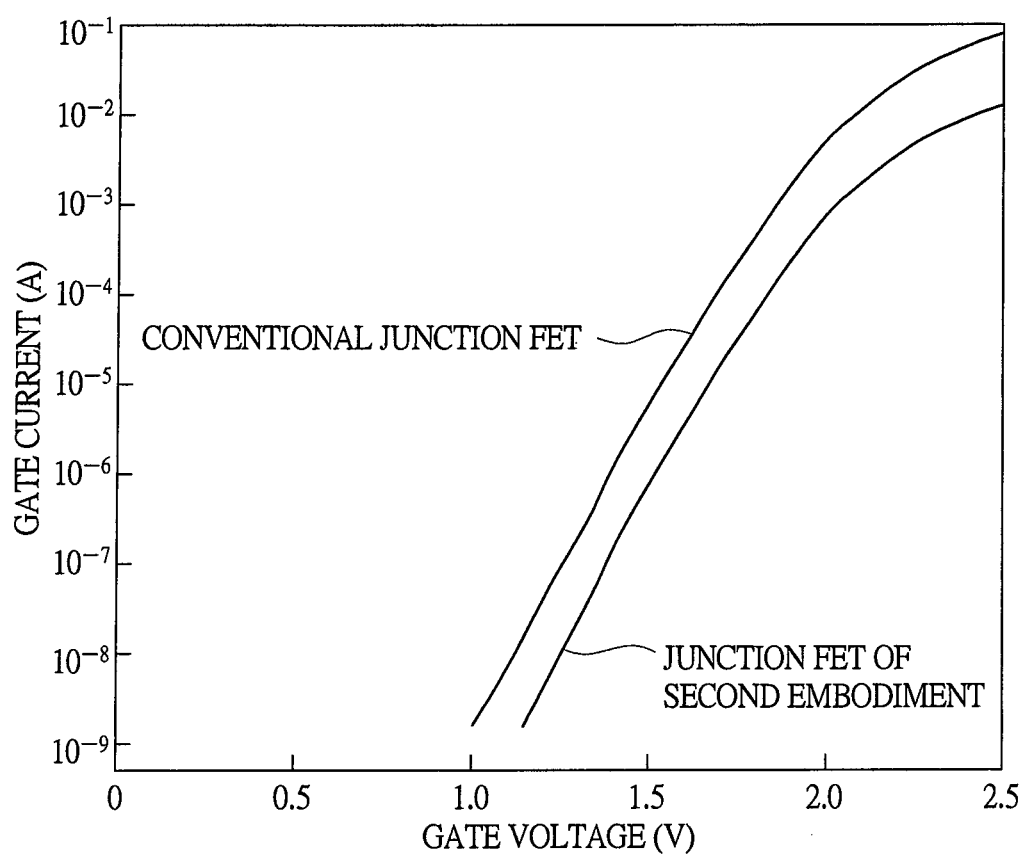
FIG. 16 is a graph for describing the characteristics of the junction FET according to the second embodiment of the present invention and the conventional junction FET.

Next, the effect of the present embodiment will be described. FIG. 16 shows the gate voltage-gate current characteristics of the respective FETs in the case where the junction FET of the present embodiment and the conventional junction FET shown in FIG. 17 are simultaneously formed on the same substrate. The leakage current is reduced in the junction FET of the present embodiment by about one order of magnitude compared with that of the conventional junction FET. This results from the fact that the interface state density on the surface on which the pn junction region is exposed on the surface of the semiconductor substrate 21 is reduced. When the inventors of the present invention simultaneously performed the dry oxidation at 1200° C. and the $N_2O$ oxidation at 1300° C. on the (11-20) surface corresponding to the sidewall of the trench 5 and then measured the interface state density, the interface state density at the valence band edge was about $1\times10^{13}$ cm$^{-2}$ eV$^{-1}$ in the dry oxidation at 1200° C., while it was about $1\times10^{12}$ cm$^{-2}$ eV$^{-1}$ and reduced by about one order of magnitude in the $N_2O$ oxidation at 1300° C.

Therefore, it is considered that the recombination current at the pn junction surface portion is reduced. Accordingly, it can be said that the interface state density on the surface on which the pn junction region is exposed on the surface of the semiconductor substrate 21 is reduced by introducing nitrogen into the side surface of the trench 5.

In the present embodiment, in the normally-off trench junction FET, nitrogen is introduced into the surface of the semiconductor oxide film 16 on the sidewall of the trench 5 to form the silicon oxynitride film on the surface of the semiconductor oxide film 16, thereby reducing the interface state density on the surface of the trench 5 compared with the conventional junction FET shown in FIG. 17, and as a result, the leakage current between the gate and the source can be reduced. Also, the influence of the interface state of the surface of the semiconductor oxide film 16 on the pn junction can be reduced by introducing an n type impurity into the sidewall of the trench 5, and the leakage current between the gate and the source can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the present invention can be applied to any junction FETs such as a lateral channel junction FET other than those described in the embodiments above. Further, the first and second embodiments above are described with taking a junction FET using a SiC substrate as an example, but the present invention can be applied to the junction FET using other wide band gap semiconductor substrate such as gallium nitride and the like.

The manufacturing method of the semiconductor device according to the present invention can be widely utilized for the junction FET formed on a wide band gap semiconductor substrate.

What is claimed is:

1. A semiconductor device comprising:
   a semiconductor substrate of a first conductivity type;
   a drift layer of the first conductivity type disposed on the semiconductor substrate;
   a source region of the first conductivity type disposed on an upper surface of the drift layer;
   a trench reaching an intermediate depth of the drift layer from an upper surface of the source region;
   a gate region of a second conductivity type being opposite to the first conductivity type disposed at a sidewall and a bottom surface of the trench in the drift layer below the source region;
   a first semiconductor region of the first conductivity type containing nitrogen as an impurity and disposed on the gate region disposed at the sidewall and the bottom surface of the trench; and
   a second semiconductor region of the first conductivity type containing nitrogen as an impurity and disposed on a side surface of the source region and above the first semiconductor region,
   wherein an impurity concentration of the first semiconductor region is lower than an impurity concentration of the second semiconductor region, and
   wherein the impurity concentration of the second semiconductor region is higher than an impurity concentration of the source region.

2. The semiconductor device according to claim 1, wherein the semiconductor substrate contains silicon carbide.

3. The semiconductor device according to claim 1,
wherein the semiconductor substrate contains gallium nitride.

4. The semiconductor device according to claim 1,
wherein a concentration of nitrogen introduced into the sidewall and the bottom surface of the trench in the drift layer below the source region is $1\times10^{18}$ cm$^{-3}$ or lower.

5. The semiconductor device according to claim 1,
wherein the first semiconductor region of the first conductivity type covers the sidewall and the bottom surface of the trench, and a pn junction region corresponding to an interface between the gate region and the source region is not exposed on the sidewall of the trench.

6. The semiconductor device according to claim 1,
wherein the second semiconductor region is directly disposed on a side surface of the source region.

7. A semiconductor device comprising:
a semiconductor substrate of a first conductivity type;
a drift layer of the first conductivity type disposed on the semiconductor substrate;
a source region of the first conductivity type disposed on an upper surface of the drift layer;
a trench disposed in the source region and the drift layer; and
a gate region of a second conductivity type being opposite to the first conductivity type disposed at a sidewall and a bottom surface of the trench in the drift layer below the source region,
wherein a first semiconductor region of the first conductivity type is disposed on the sidewall and the bottom surface of the trench at which the gate region is disposed,
wherein a second semiconductor region of the first conductivity type is disposed on the sidewall of the trench at which the source region is disposed, and
wherein an impurity concentration of the first semiconductor region is lower than an impurity concentration of the second semiconductor region, and
wherein the impurity concentration of the second semiconductor region is higher than an impurity concentration of the source region.

8. The semiconductor device according to claim 7,
wherein the semiconductor substrate includes silicon carbide.

9. The semiconductor device according to claim 7,
wherein the semiconductor substrate includes gallium nitride.

10. The semiconductor device according to claim 7,
wherein an impurity concentration of the first semiconductor region is $1\times10^{18}$ cm$^{-3}$ or lower.

11. The semiconductor device according to claim 7,
wherein the first semiconductor region covers the sidewall and the bottom surface of the trench, and a pn junction region corresponding to an interface between the gate region and the source region is not exposed on the sidewall of the trench.

12. The semiconductor device according to claim 7,
wherein the second semiconductor region is directly disposed on a side surface of the source region.

\* \* \* \* \*